United States Patent
Chen et al.

(10) Patent No.: US 6,605,966 B1
(45) Date of Patent: Aug. 12, 2003

(54) APPARATUS AND METHOD FOR TESTING CROSSOVER VOLTAGE OF DIFFERENTIAL SIGNALS

(75) Inventors: Po-chuan Chen, Hsin-Tien (TW); Ta-Hsiu Huang, Taipei (TW); Shou-Cheng Kao, Chung-Ho (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 09/510,589

(22) Filed: Feb. 22, 2000

(30) Foreign Application Priority Data

Aug. 23, 1999 (TW) ........................................ 88114368 A

(51) Int. Cl.[7] ............................................. H03K 5/153
(52) U.S. Cl. ........................................ 327/76; 327/74
(58) Field of Search ............................. 327/74, 80, 76, 327/50, 58, 90

(56) References Cited

U.S. PATENT DOCUMENTS

| | | | | | |
|---|---|---|---|---|---|
| 4,149,160 A | * | 4/1979 | Bozarth et al. | ............. | 340/661 |
| 4,255,792 A | * | 3/1981 | Das | ............. | 702/117 |
| 4,968,902 A | * | 11/1990 | Jackson | ............. | 327/74 |
| 5,210,527 A | * | 5/1993 | Smith et al. | ............. | 340/659 |
| 5,324,995 A | * | 6/1994 | Yee | ............. | 327/91 |
| 5,336,947 A | * | 8/1994 | Lehning | ............. | 327/1 |
| 5,534,770 A | * | 7/1996 | Yaklin | ............. | 323/284 |
| 5,544,175 A | * | 8/1996 | Posse | ............. | 714/719 |
| 5,703,505 A | * | 12/1997 | Kwon | ............. | 327/75 |
| 5,969,557 A | * | 10/1999 | Tanzawa et al. | ............. | 327/131 |
| 6,362,663 B1 | * | 3/2002 | Criscione et al. | ............. | 327/74 |

FOREIGN PATENT DOCUMENTS

JP      63037267 A  *  2/1988   ........... G01R/31/28

* cited by examiner

Primary Examiner—Timothy P. Callahan
Assistant Examiner—Cassandra Cox

(57) ABSTRACT

An apparatus and method for processing a differential-type signal transmitted through a pair of data lines. First, a voltage range defined by an upper reference and a lower reference and a logic pattern are provided. Then, the signal is tested to generate logic data responsive to the voltage range. Next, the logic data are utilized to compare with the logic pattern so as to generate a test result when the signal enters a transition cycle.

43 Claims, 3 Drawing Sheets

US 6,605,966 B1

APPARATUS AND METHOD FOR TESTING CROSSOVER VOLTAGE OF DIFFERENTIAL SIGNALS

BACKGROUND OF THE INVENTION

1. Field of the Invention

The present invention generally relates to testing methodology. More particular, the present invention relates to an apparatus for testing the crossover voltage of differential signals and its method.

2. Description of the Related Art

Traditional serial bus connections like RS-232C has at least three shortcomings: transmission speed is slow, use is complicated, and connection is limited to only a few ports. Ever since the introduction of the Universal Serial Bus (referred to as "USB" hereafter) in 1996, USB has been gladly received as the newly established standard for the next generation serial bus connections with new functionality like plug & play, 12 Mbits/sec high speed transmission, support for up to 127 peripheral devices, fault-proof connector design, and low cost, etc. At present, there are a number of computer peripheral devices supporting USB standard on the market such as monitors, keyboards, mouse's, joysticks, scanners, printers, and digital cameras, etc.

The USB bus employs a line pair for transmitting differential-type data signals. Referring to FIG. 1, the voltage waveform on data pins DP and DN of the USB bus is shown schematically, where $V_H$ and $V_L$ denote a logic-high level and a logic-low level, respectively. During a transition cycle, that is, when the voltage of the data pin DP transits from the logic-high level $V_H$ to the logic-low level $V_L$ and the voltage of the data pin DN transits from the logic-low level $V_L$ to the logic-high level $V_H$, or vice versa, the voltage signals intersect at a point A. Usually, the voltage at the crossover point A is denominated as a crossover voltage $V_{crs}$, where the timing placement of the crossover point A is represented by $T_{crs}$. If the USB bus runs at a lower transmission rate, such as 1.5 Mbits/sec, the transition cycle is about 75~300 ns; if the USB bus operates at a higher transmission rate, such as 12 Mbits/sec, the transition cycle will be in the range of about 4~20 ns.

The crossover voltage $V_{crs}$ is an important parameter for evaluating USB output signals. As an example, assuming that the logic-high level $V_H$ is set to 3.3V and the logic-low level $V_L$ set to 0V, the crossover voltage $V_{crs}$ should be specified within the range of about 1.3~2.0V.

Referring to FIG. 2, a conventional apparatus for testing the crossover voltage $V_{crs}$ is schematically illustrated. As shown in the drawing, the conventional testing apparatus includes a comparator 20 configured with two input terminals connected to the data pins DP and DN, respectively. At the crossover point A, the comparator 20 generates an output signal 22 with a abrupt transition edge to trigger a voltage sampler 24. The voltage sampler 24, responsive to the abrupt transition edge, samples the voltages of the data pins DP and DN and generates the sampled value at an output terminal 26. The sampled voltage is then read by a parameter measurement unit (not shown in the drawing) of a tester.

Though the operation speed of the comparator 20 and the voltage sampler 24 is so restrictive that the sampled voltage is more or less deviated from the crossover voltage $V_{crs}$, the sampled voltage can approximate the crossover voltage $V_{crs}$ quite well. However, the use of the comparator 20 and the voltage sampler 24 require modification of the circuitry on a load board connected between a unit-under-test (UUT) and the tester. The expense required to manufacture a resigned load board is high (up to thousands of U.S. dollars); therefore, it is not a cost-effective approach.

SUMMARY OF THE INVENTION

It is therefore an object of the present invention to provide an apparatus and a method for testing the crossover voltage of differential signals without modifying the circuitry on a load board connected between a UUT and a tester.

To attain the above-identified object, the present invention provides an apparatus for processing a signal transmitted through a pair of data lines. The apparatus has two tester channels, each of which corresponds to one of the data lines and comprises a first comparator and a second comparator and a logic circuit. The first comparator is configured with a first inverting input for receiving an upper reference and a first non-inverting input for connecting with the corresponding data line. The second comparator is configured with a second inverting input for connecting with the corresponding data line and a second non-inverting input for receiving a lower reference. The logic circuit is electrically coupled to the first comparator and the second comparator. When the signal enters a transition cycle, the first comparator and the second comparator generate logic data responsive to the upper reference and the lower reference. Then, the logic circuit compares the logic data with a logic pattern and generates a test result, accordingly.

In addition, the present invention provides a method for processing a signal transmitted through a pair of data lines. First, a voltage range defined by an upper reference and a lower reference and a logic patter are provided. Then, the signal is tested to generate logic data responsive to the voltage range. Next, the logic data are utilized to compare with the logic pattern so as to generate a test result when the signal enters a transition cycle.

BRIEF DESCRIPTION OF DRAWINGS

The following detailed description, given by way of examples and not intended to limit the invention to the embodiments described herein, will best be understood in conjunction with the accompanying drawings, in which.

DETAILED DESCRIPTION OF THE INVENTION

Figure 3:
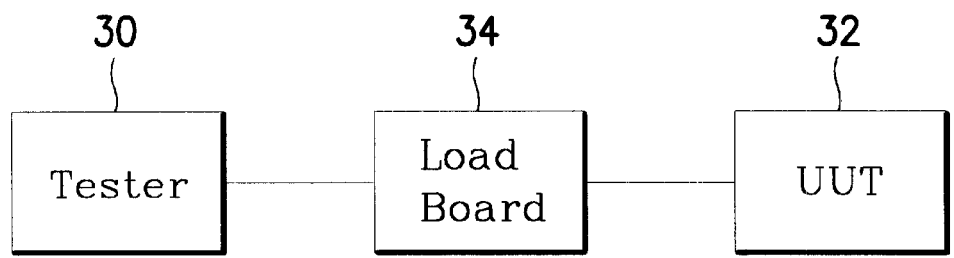
FIG. 3 schematically depicts a block diagram of a conventional test system.

Referring to FIG. 3, a block diagram of a conventional test system is schematically illustrated. In the drawing, a tester 30 is used to test a UUT 32, such as a USB bus in the following embodiment, according to the required program loaded therein. Moreover, the tester 30 is electrically coupled to the UUT 32 by a load board 34, which serves as an hardware interface between the tester 30 and the UUT 32.

Figure 1:
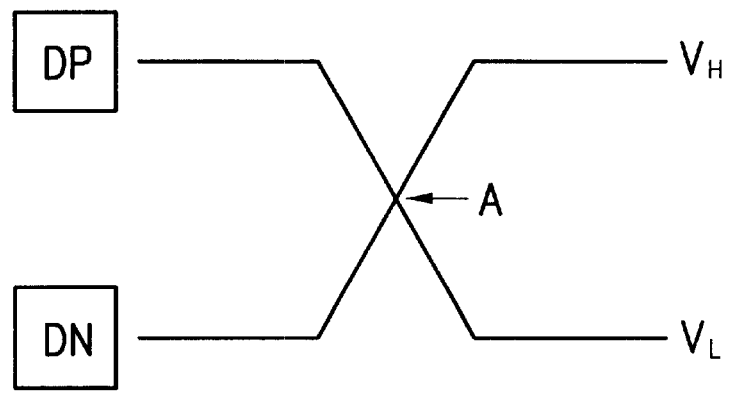
FIG. 1 schematically illustrates the voltage waveform on data pins DP and DN of a USB bus.
Figure 2:
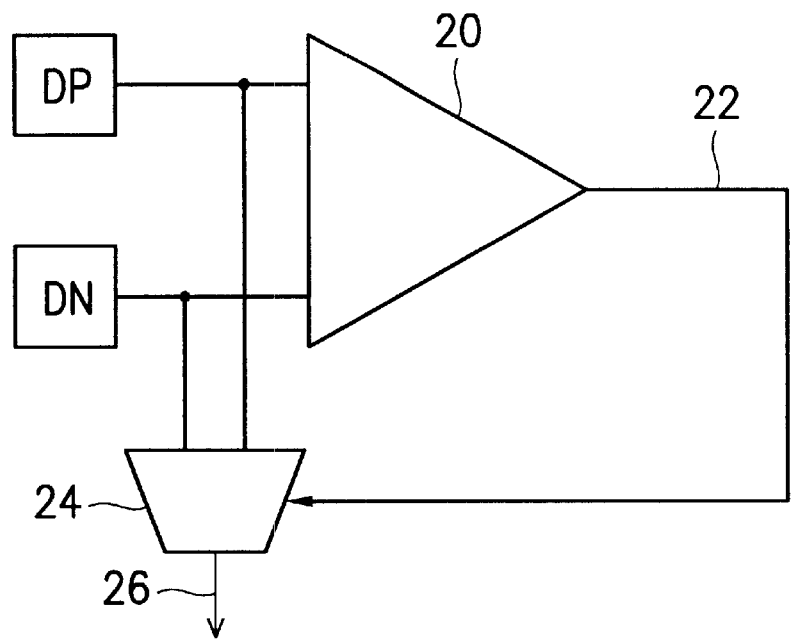
FIG. 2 schematically illustrates a conventional apparatus for testing the crossover voltage $V_{crs}$.

Because the conventional testing apparatus of FIG. 2 utilizes the comparator 20 and the voltage sampler 24, the load board 34 coupled between the tester 30 and the UUT 32 must be modified, thereby imposing a cost burden on testing. Therefore, the present invention provides an apparatus and a method for testing the crossover voltage of differential signals which makes some modifications at end of the tester 30, but none to the load board 34, thereby saving the expense for redesigning the load board 34.

Figure 4:
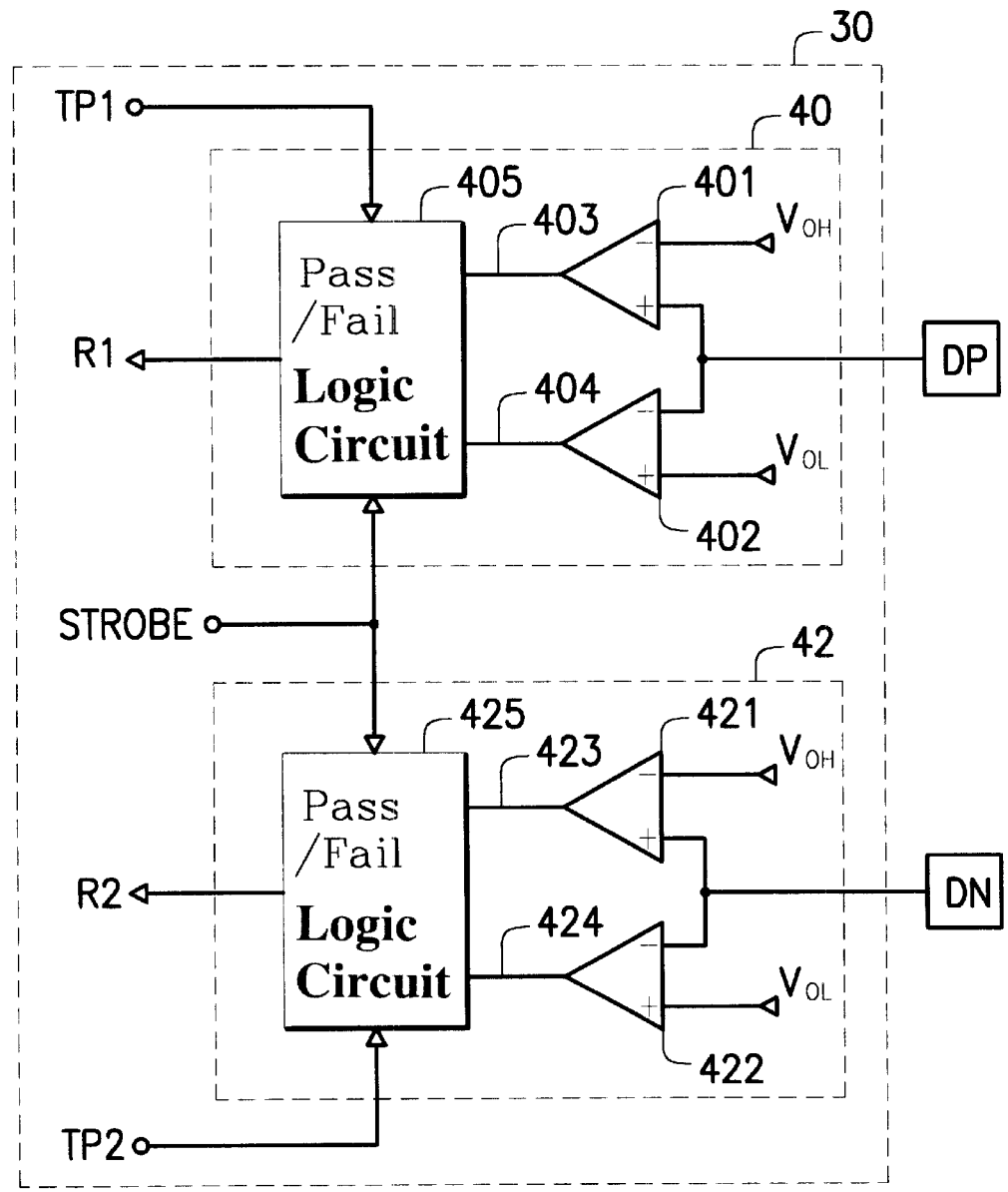
FIG. 4 schematically depicts a block diagram of an apparatus for testing the crossover voltage of differential signals in accordance with one preferred embodiment of the present invention.

As shown in FIG. 4, a block diagram of an apparatus for testing the crossover voltage of differential signals in accordance with one preferred embodiment of the present invention is schematically illustrated. The testing apparatus of the present invention can be applied to those UUTs utilizing differential signals, such as USB, IEEE-1394, or Ethernet. In the following, the USB bus is exemplified, but not intended to limit the scope of the present invention to the embodiments described below. In particular, the testing apparatus of FIG. 4 is established by merely modifying the test program loaded into the tester 30.

As shown in FIG. 4, the testing apparatus is provided with two tester channels 40 and 42 connected to the data pins DP and DN, respectively. The tester channel 40 comprises two comparators 401 and 402, and a pass/fail logic circuit 405. The comparator 401 is configured with an inverting input terminal connected to an upper reference voltage $V_{OH}$, while the comparator 402 is configured with a non-inverting input terminal connected to a lower reference voltage $V_{OL}$. When the crossover voltage $V_{crs}$ of the USB bus is specified within the range of 1.3~2.0V, the upper reference voltage $V_{OH}$ can be set to 2.0V and the lower reference voltage $V_{OL}$ can be set to 1.3V. In FIG. 4, the non-inverting input terminal of the comparator 401 and the inverting input terminal of the comparator 402 are tied together to connect with the data pin DP. The comparators 401 and 402 are provided with respective output terminals 403 and 404 to send out logic data for the pass/fail logic circuit 405. The pass/fail logic circuit 405 has an input terminal TP1 for receiving test patterns to be compared with the logic data at the output terminals 403 and 404, which are generated by the comparators 401 and 402, respectively. If the logic data correspond to the test pattern, the pass/fail logic circuit 405 generates a "PASS" signal, or otherwise a "FAIL" signal, from an output terminal R1. The corresponding relation among the voltage $V_{DP}$ at the data pin DP, the logic states at the outputs 403 and 404 of the comparators 401 and 402, and the test pattern at the input TP1 are listed in the following Table 1.

TABLE 1

| VDP | 403 | 404 | TP1 |
| --- | --- | --- | --- |
| $V_{DP} > V_{OH} > V_{OL}$ | H | L | H |
| $V_{OH} > V_{DP} > V_{OL}$ | L | L | Z |
| $V_{OH} > V_{OL} > V_{DP}$ | L | H | L |

H denotes the logic-high state, L the logic-low state, and Z a high impedance state.

In addition, the tester channel 42 comprises two comparators 421 and 422, and a pass/fail logic circuit 425. The comparator 421 is configured with an inverting input terminal connected to the upper reference voltage $V_{OH}$, while the comparator 422 is configured with a non-inverting input terminal connected to the lower reference voltage $V_{OL}$. When the crossover voltage $V_{crs}$ of the USB bus is specified within the range of 1.3~2.0V, the upper reference voltage $V_{OH}$ can be set to 2.0V and the lower reference voltage $V_{OL}$ can be set to 1.3V. In FIG. 4, the non-inverting input terminal of the comparator 421 and the inverting input terminal of the comparator 422 are tied together and connected to the data pin DN. The comparators 421 and 422 are provided with respective output terminals 423 and 424 to send out the logic data for the pass/fail logic circuit 425. The pass/fail logic circuit 425 has an input terminal TP2 for receiving test patterns to be compared with the logic data at the output terminals 423 and 424, which are generated by the comparators 421 and 422, respectively. If the logic data correspond to the test pattern, the pass/fail logic circuit 425 generates a "PASS" signal, or otherwise a "FAIL" signal, at an output terminal R2. The corresponding relations among the voltage $V_{DP}$ at the data pin DN, the logic states at the outputs 423 and 424 of the comparators 421 and 422, and the test pattern at the input TP2 are listed in the following Table 2.

TABLE 1

| VDP | 423 | 424 | TP2 |
| --- | --- | --- | --- |
| $V_{DP} > V_{OH} > V_{OL}$ | H | L | H |
| $V_{OH} > V_{DP} > V_{OL}$ | L | L | Z |
| $V_{OH} > V_{OL} > V_{DP}$ | L | H | L |

H denotes the logic-high state, L the logic-low state, and Z the high impedance state.

Moreover, both the pass-fail logic circuits 405 and 425 are controlled by a select signal STROBE.

Figure 5:
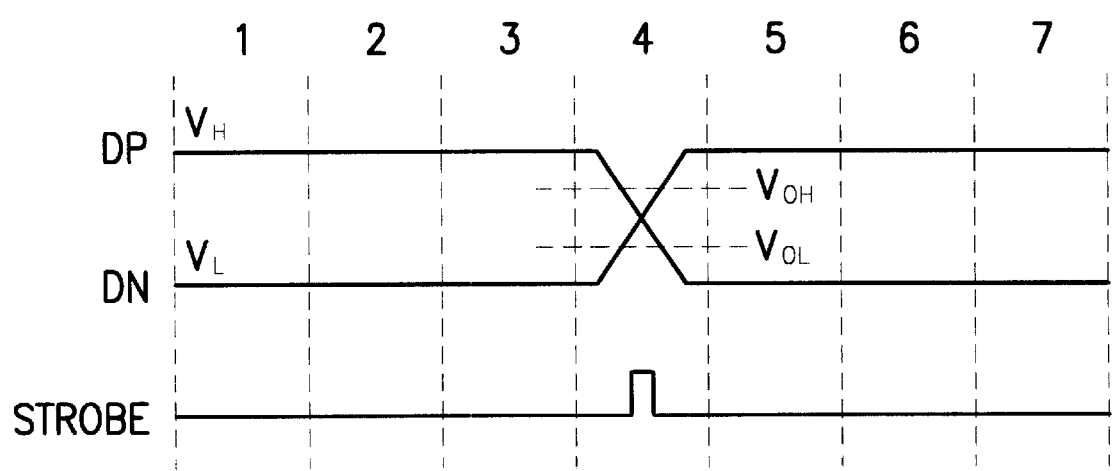
FIG. 5 illustrates the waveform of data lines DP, DN and a select signal STROBE.

Referring to FIG. 5, the voltage waveform of the data lines DP, DN and select signal STROBE is shown as an example for description. The detailed operation of the testing apparatus of FIG. 4 will be described in conjunction with FIG. 5. For simplicity and convenience, the timeline is divided into seven cycles 1~7, wherein the voltage of the data pin DP transits from the logic-high level $V_H$ to the logic-low level $V_L$ and the voltage of the data pin DN transits from the logic-low level $V_L$ to the logic-high level $V_H$ during the cycle 4, that is, a transition cycle.

The corresponding relation between the test pattern at inputs TP1 and TP2 and the test results at the outputs R1 and R2 are listed in the following Table 3.

TABLE 3

| CYCLE | TP1 | TP2 | R1 | R2 |
| --- | --- | --- | --- | --- |
| 1 | H | L | P | P |
| 2 | H | L | P | P |
| 3 | H | L | P | P |
| 4 | Z | Z | To be tested | To be tested |
| 5 | L | H | P | P |
| 6 | L | H | P | P |
| 7 | L | H | P | P |

P denotes the "PASS" signal generated from the output terminal R1 or R2.

According to the present invention, in the transition cycle (cycle 4), the crossover voltage of the data pins DP and DN is to be tested. For to the other cycles, both the test output terminals R1 and R2 send out the "PASS" signals. As shown in Table 3, both the test patterns of input terminals TP1 and TP2 are set to high-impedance state Z in the cycle 4. Therefore, in response to the select pulse STROBE, the data pins DP and DN are tested to determine whether their voltages are within the specified range, defined by the upper reference voltage $V_{OH}$ and the lower reference voltage $V_{OL}$ or not.

During the active period of the select pulse STROBE, if the voltages at the data pins DP and DN are within the voltage range defined by the $V_{OH}$ and VOL? the test output terminals R1 and R2 send out the "PASS" signals. If any one voltage at the data pins DP or DN exceeds the voltage range defined by the $V_{OH}$ and $V_{OL}$, the corresponding output terminals R1 or R2 sends out the "FAIL" signal.

Furthermore, the timing of the select pulse STROBE can be generated by means of a linear searching method or a binary searching method.

Accordingly, the crossover voltage $V_{crs}$ of the data pins DP and DN can be tested to determine whether it falls within the voltage range defined by the $V_{OH}$ and $V_{OL}$. Moreover, though $V_{OH}$=2.0V and $V_{OL}$=1.3V are exemplified as above, the voltage range can be narrowed by redefining $V_{OH}$ and $V_{OL}$, such as 1.6V and 1.7V in conjunction with the pulse timing of the select signal STROBE, respectively, so as to approximate crossover voltage $V_{crs}$ more accurately.

Because the testing apparatus of the present invention is installed in the tester 30 of FIG. 3, the tester 30 can control the relays to establish the circuitry of FIG. 4 by merely modifying the test program loaded therein. Although the USB signals are exemplified in the aforementioned embodiment, the testing apparatus of the present invention can be also applied to those circuits employing differential signals, such as IEEE-1394, Ethernet, and so on.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. An apparatus for processing a signal transmitted through a pair of data lines, comprising:
    two tester channels, each of which corresponds to one of said data lines and comprises:
    a first comparator having a first inverting input for receiving an upper reference and a first non-inverting input for connecting with said corresponding data line;
    a second comparator having a second inverting input for connecting with said corresponding data line and a second non-inverting input for receiving a lower reference; and
    a logic circuit coupled to said first comparator and said second comparator; wherein said first comparator and said second comparator generate logic data responsive to said upper reference and said lower reference when said signal enters a transition cycle, and said logic circuit compares said logic data with a logic pattern and generates a test result, accordingly.

2. The apparatus as claimed in claim 1, wherein said signal is a differential-type signal.

3. The apparatus as claimed in claim 2, wherein said differential-type signal has a crossover point during said transition cycle.

4. The apparatus as claimed in claim 3, wherein said logic pattern corresponds to said logic data when said crossover point is within said upper reference and said lower reference.

5. The apparatus as claimed in claim 4, wherein said test result is a "PASS" signal.

6. The apparatus as claimed in claim 3, wherein logic pattern does not correspond to said logic data when said crossover point exceeds a range defined by said upper reference and said lower reference.

7. The apparatus as claimed in claim 6, wherein said test result is a "FAIL" signal.

8. The apparatus as claimed in claim 2, wherein said differential-type signal is a USB signal.

9. The apparatus as claimed in claim 2, wherein said differential-type signal is an IEEE-1394 signal.

10. The apparatus as claimed in claim 2, wherein said differential-type signal is an Ethernet signal.

11. The apparatus as claimed in claim 1, wherein said logic circuit compares said logic data with said logic pattern in response to a strobe signal.

12. A method for processing a signal transmitted through a pair of data lines, comprising:
    providing a voltage range defined by an upper reference and a lower reference;
    providing a logic pattern;
    testing the signal to generate logic data responsive to the voltage range; and
    comparing the logic data with the logic pattern without storing the logic data to generate a test result when the signal enters a transition cycle.

13. The method as claimed in claim 12, wherein said signal is a differential-type signal.

14. The method as claimed in claim 13, wherein said differential-type signal has a crossover point during said transition cycle.

15. The method as claimed in claim 14, wherein said logic pattern corresponds to said logic data when said crossover point is within said voltage range.

16. The method as claimed in claim 15, wherein said test result is a "PASS" signal.

17. The method as claimed in claim 14, wherein logic pattern does not correspond to said logic data when said crossover point exceeds said voltage range.

18. The method as claimed in claim 17, wherein said test result is a "FAIL" signal.

19. The method as claimed in claim 13, wherein said differential-type signal a USB signal.

20. The method as claimed in claim 13, wherein the differential-type signal is an IEEE-1394 signal.

21. The method as claimed in claim 13, wherein the differential-type signal is an Ethernet signal.

22. The method as claimed in claim 12, wherein the comparing is performed in response to a strobe signal.

23. An apparatus for processing a signal transmitted through a pair of data lines, comprising:
    two tester channels, each of which corresponds to one of the data lines and comprises:
    a first comparator having a first inverting input for receiving an upper reference and a first non-inverting input for connecting with the corresponding data line;
    a second comparator having a second inverting input for connecting with the corresponding data line and a second non-inverting input for receiving a lower reference; and
    a logic circuit coupled to the first comparator and the second comparator, wherein the first comparator and the second comparator generate logic data responsive to the upper reference and the lower reference when the signal enters a transition cycle, the logic circuit compares the logic data with a logic pattern and generates a test result, accordingly, and the signal is a differential-type signal.

24. The apparatus as claimed in claim 23, wherein the differential type signal has a crossover point during the transition cycle.

25. The apparatus as claimed in claim 24, wherein the logic pattern corresponds to the logic data when the crossover point is within the upper reference and the lower reference.

26. The apparatus as claimed in claim 25, wherein the test result is a "PASS" signal.

27. The apparatus as claimed in claim 24, wherein the logic pattern does not correspond to the logic data when the crossover point exceeds a range defined by the upper reference and the lower reference.

28. The apparatus as claimed in claim 27, wherein the test result is a "FAIL" signal.

29. The apparatus as claimed in claim 23, wherein the differential-type signal is a USB signal.

30. The apparatus as claimed in claim 23, wherein the differential-type signal is an IEEE-1394 signal.

31. The apparatus as claimed in claim 23, wherein the differential-type signal is an Ethernet signal.

32. The apparatus as claimed in claim 23, wherein the logic circuit compares the logic data with the logic pattern in response to a strobe signal.

33. A method for processing a signal transmitted through a pair of data lines, comprising:

providing a voltage range defined by an upper reference and a lower reference;

providing a logic pattern;

testing the signal to generate logic data responsive to the voltage range; and comparing the logic data with the logic pattern to generate a test result when the signal enters a transition cycle;

wherein the signal is a differential-type signal.

34. The method as claimed in claim 33, wherein the differential-type signal has a crossover point during the transition cycle.

35. The method as claimed in claim 34, wherein the logic pattern corresponds to the logic data when the crossover point is within the upper reference and the lower reference.

36. The method as claimed in claim 35, wherein the test result is a "PASS" signal.

37. The apparatus as claimed in claim 34, wherein the logic pattern does not correspond to the logic data when the crossover point exceeds the voltage range.

38. The method as claimed in claim 37, wherein the test result is a "FAIL" signal.

39. The method as claimed in claim 33, wherein the differential-type signal is a USB signal.

40. The method as claimed in claim 33, wherein the differential-type signal is an IEEE-1394 signal.

41. The method as claimed in claim 33, wherein the differential-type signal is an Ethernet signal.

42. The method as claimed in claim 33, wherein the comparing is performed in response to a strobe signal.

43. A method for processing a signal transmitted through a pair of data lines, comprising:

providing a voltage range defined by an upper reference and a lower reference;

providing a logic pattern;

testing the signal to generate logic data responsive to the voltage range; and immediately after testing, receiving the generated logic data and immediately thereafter comparing the received logic data with the logic pattern to generate a test result when the signal enters a transition cycle.

* * * * *